United States Patent
Barber et al.

(10) Patent No.: US 6,600,220 B2
(45) Date of Patent: Jul. 29, 2003

(54) POWER DISTRIBUTION IN MULTI-CHIP MODULES

(75) Inventors: Vernon Alan Barber, Sandpoint, ID (US); Hannsjörg Obermaier, Los Gatos, CA (US); Chandrakant D. Patel, Fremont, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/854,544

(22) Filed: May 14, 2001

(65) Prior Publication Data

US 2002/0167080 A1 Nov. 14, 2002

(51) Int. Cl.[7] ............................................. H01L 23/02
(52) U.S. Cl. ..................... 257/685; 257/684; 257/691; 257/693; 257/696; 257/700; 361/761; 361/794; 363/147
(58) Field of Search ................... 257/684, 685, 257/691, 693, 676, 668, 700; 361/794, 761; 363/147

(56) References Cited

U.S. PATENT DOCUMENTS

| | | | |
|---|---|---|---|
| 4,954,878 A | | 9/1990 | Fox et al. |
| 5,384,691 A | * | 1/1995 | Neugebauer et al. ....... 361/794 |
| 5,444,298 A | * | 8/1995 | Schutz .................... 257/691 |
| 5,723,906 A | * | 3/1998 | Rush ....................... 257/723 |
| 5,736,796 A | * | 4/1998 | Price et al. ................ 307/151 |
| 5,847,951 A | * | 12/1998 | Brown et al. ............... 363/147 |
| 5,914,873 A | | 6/1999 | Blish, II |

* cited by examiner

Primary Examiner—Nathan J. Flynn
Assistant Examiner—Remmon R. Fordé

(57) ABSTRACT

A multi-chip module (MCM) having a substrate including a first surface, a second surface and a multi-layer interconnection arrangement disposed between the two surfaces. A high-density thin-film circuit region is provided on the substrate first surface to interconnect a plurality of integrated circuit chips and the multi-layer interconnection arrangement. The integrated circuit chips are powered through the high-density thin-film circuit region, which receives power from the multi-layer interconnection arrangement. A plurality of discrete on-board voltage converter devices, mounted on at least one substrate surface, provide uniform power supply distribution to multi-layer interconnection arrangement power planes, converting an MCM input voltage and current to a relatively lower output voltage and a relatively higher output current. On-board voltage conversion permits the MCM to receive power at higher voltages than is supported by the high-density thin-film circuit region, decreasing MCM input current magnitudes and reducing noise and energy losses. The voltage converters are discrete components. Electrically-isolated MCM power regions isolate power and ground noise.

19 Claims, 7 Drawing Sheets

POWER DISTRIBUTION IN MULTI-CHIP MODULES

FIELD OF THE INVENTION

The present invention generally relates to the design of integrated circuit devices and, more particularly, to the distribution of power to a multi-chip module integrated circuit device.

BACKGROUND OF THE INVENTION

The power demand for multi-chip module ("MCM") technology integrated circuits ("IC") is rapidly increasing due to aggressive circuit miniaturization measures. Integrated circuit chip performance and power density are increasing, in part, by increasing the quantity of logic gates within a given integrated circuit chip surface area. New high-density thin-film interconnection technology allows increased IC chip density, and thus greater quantities of ICs on an MCM. Constructing MCMs using a greater density, thus greater quantity, of ICs, each using more and more power, is rapidly driving up MCM power density and total MCM power requirements.

Higher density often means less physical separation between components. Less physical separation in turn, reduces available dielectric insulation. Less available dielectric insulation favors circuit operation at lower voltages. Lowering operating voltages necessitates higher current magnitudes to supply equivalent power loads. All else being equal, heating (IR) losses increase as power is distributed at lower voltages and higher currents. Increasing MCM power loads while simultaneously reducing MCM operating voltage levels drives required current magnitudes even higher.

Efforts to further enhance IC performance also include use of higher clock frequencies to increase the quantity of operations performed per unit time. Operation at higher frequencies requires additional energy to charge a greater parasitic capacitance (capacitive impedance is a function of frequency). Finally, an MCM having higher power density and increased total power requirements is subject to elevated localized operating temperatures which can increase semiconductor resistance, in turn resulting in further heating (IR) losses that must be powered.

The need to transmit greater magnitudes of current at a given (constant) voltage level, generally mandates using a larger conductor to accommodate greater current-carrying capacity within thermal limits. In MCM applications, where "real estate" is valuable, increasing conductor physical size, and/or the quantity of conductors, is a significant engineering cost consideration. Other design concerns accompany larger current magnitudes as well, including greater inductive losses and more generation of L(di/dt) switching noise.

Further complicating matters, MCM designers may wish to integrate a heterogeneous variety of integrated circuit and discrete component technologies into a single application. Differing technologies often require power supplies at their own unique voltage level. Supplying an MCM with a plurality of power supply voltages increases MCM internal and external circuit complexity. Additionally, each isolated power supply voltage level requires valuable MCM surface area termination space.

SUMMARY OF THE INVENTION

A multi-chip module (MCM) device and method for making a MCM are provided. The MCM includes a substrate having a first and a second surface, and a stepped-edge surface. A high-density thin-film circuit region is disposed on the first surface. Signal pins are disposed on the second surface. Power pins are disposed on the stepped-edge surface. A multi-layer interconnect arrangement is disposed between first and second surfaces, coupling circuitry in the high-density thin-film circuit region to the signal and power pins. A plurality of integrated circuit chips are disposed on the high-density thin-film circuit region. Each of the integrated circuit chips has a plurality of signal terminals and power terminals. The signal terminals and power terminals coupled to circuitry in the high-density thin-film circuit region. A first plurality of voltage converters is disposed on the first substrate surface outside the high-density thin-film circuit region. The voltage converters are discrete components. Each voltage converter has a plurality of power input terminals and power output terminals coupled to the multi-layer interconnect arrangement, electrically located between the power pins and the high-density thin-fihn circuit region. The voltage converters convert an input voltage and an input current to a relatively lower output voltage and a relatively higher output current. On-board voltage conversion permits the MCM to receive power at higher voltage than is supported by the high-density thin-film circuit region. Receiving power at a higher voltage reduces power supply current magnitudes. Therefore, the MCM requires fewer and smaller power pins, and less substrate surface area dedicated to accommodate power pins.

A second plurality of voltage converters is disposed on the second substrate surface in substantial alignment with the high-density thin-film circuit region. Optionally, the portion of second substrate surface in substantial alignment with the high-density thin-film region is recessed. The multi-layer interconnect arrangement has at least one power plane layer and a complimentary ground plane layer. Each power plane layer has an interior portion substantially aligned with the high-density thin-film circuit region. The power plane layer also has a peripheral portion. The high-density thin-film circuit region draws power from the interior portion of a power plane. The first plurality of voltage converters supply power to the peripheral portion of the power planes and the second plurality of voltage converters supply power to the interior portion of the power planes, thus contributing to more uniform power distribution across the power planes.

A method of making an MCM of the present invention is provided. A substrate having a first and a second surface is formed with a multi-layer interconnect arrangement disposed therebetween. A high-density thin-film circuit region is formed and coupled to the multi-layer interconnect arrangement. A plurality of integrated circuit chips are disposed on and coupled to circuitry in the high-density thin-film circuit region. The substrate having power pins, signal pins, the multi-layer interconnect arrangement, and the high-density thin-film circuit region form an MCM subassembly. Optionally, the MCM subassembly also includes the integrated circuit chips. Operability of the MCM subassembly is tested. Operability of the integrated circuit chips and plurality of voltage converters is tested prior to mounting each to the MCM. Subsequent to MCM subassembly testing, the plurality of voltage converters is mounted to the MCM subassembly and electrically coupled to the multi-layer interconnect arrangement.

BRIEF DESCRIPTION OF THE DRAWINGS

The invention may be more completely understood in consideration of the following detailed description of various embodiments of the invention in connection with the accompanying drawings, in which.

Figure 1A:
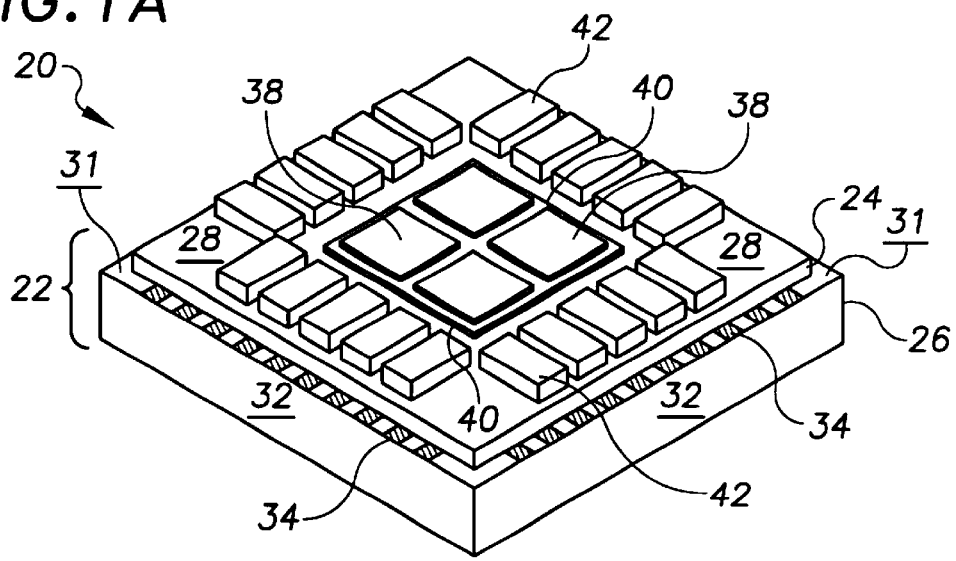
FIG. 1A is a top perspective view of one example embodiment of a multi-chip module ("MCM") illustrating arrangement of voltage converters on the MCM first substrate surface in accordance with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Thin-film technology is well adapted for high-density, on-board power and data signal interconnections in multi-chip module ("MCM") applications. An MCM using high-density thin-film technology to support I/O and power requirements for higher performance integrated circuits (IC), such as microprocessors and the like, is provided. The MCM includes a substrate having a first surface, a second surface and a stepped-edge surface. A high-density thin-film circuit region, having circuits therein, is disposed on the first MCM surface and coupled to at least one power plane layer of a multi-layer interconnect arrangement. In a further embodiment, at least two power plane layers are provided, at least one being a complimentary ground plane layer. The power plane layer has an internal portion, in substantial alignment with the high-density thin-film circuit region, and a peripheral portion everywhere outside the interior portion. Power pins are disposed on the MCM stepped-edge surface and adapted to receive power from power sources external to the MCM. The power pins are coupled to the multi-layer interconnect arrangement. A plurality of integrated circuits are disposed on the high-density thin-film circuit region and coupled thereto. The integrated circuits, via circuitry in the high-density thin-film circuit region, the multi-layer interconnect arrangement and the power pins, draw power received by the MCM for the IC's operation.

The MCM further includes a first plurality of discrete component, on-board voltage converters for converting power received at the MCM at one input voltage level and input current magnitude, to a relatively lower output voltage level and relatively higher output current magnitude. The first plurality of voltage converters are disposed on the substrate first surface, in close proximity to the high-density thin-film circuit region. The first plurality of voltage converters are coupled to at least one power plane layer of the multi-layer interconnect arrangement. The voltage converters are optionally also coupled to a complimentary ground plane layer. The first plurality of voltage converters being electrically located between the power pins and circuitry in the high-density thin-film circuit region. The first plurality of voltage converters is adapted to provide power to the peripheral portion of the multi-layer interconnect arrangement power plane layer.

The MCM further includes a second plurality of discrete component, on-board voltage converters for converting power received at the MCM at one input voltage level and input current magnitude, to a relatively lower output voltage level and relatively higher output current magnitude. The second plurality of voltage converters are disposed on the second MCM surface, in substantial alignment with the high-density thin-film circuit region. The second plurality of voltage converters are also coupled to at least one power plane layer of the multi-layer interconnect arrangement, a complimentary ground plane layer, and electrically located between the power pins and circuitry in the high-density thin-film circuit region. The second plurality of voltage converters is adapted to provide power to the interior portion of the multi-layer interconnect arrangement power plane layer.

In another embodiment, a method of making an MCM is provided. Due to the density of components and interconnections, failure of an MCM component or interconnection is not easily corrected and often results in loss of the entire MCM. Failure of a voltage converter embedded, or otherwise integrally incorporated, within the ceramic MCM substrate structure, can lead to loss of the entire MCM. The method of making an MCM of the present invention, using discrete component, on-board voltage converters added to the external surfaces of the MCM, permits intermediate testing of an MCM subassembly functionality and electrical path continuity prior to mounting and electrically coupling the voltage converters. Additionally, operability of the voltage converters, and optionally ICs, themselves can be tested prior to mounting these discrete components to the MCM. Detection of faulty voltage converters and ICs prior to incorporation into the MCM, confines the costs of failures to the component itself, rather than the entire MCM.

FIG. 1A is a top perspective view of an MCM according to one example embodiment of the invention. MCM 20 comprises a substrate 22 having a multi-layer interconnect arrangement layer 24 and a pad layer 26. Although not visible in the perspective view of FIG. 1A, multi-layer interconnect arrangement layer 24 contains multi-layer interconnect arrangement 25 within its ceramic structure. Multi-layer interconnect arrangement layer 24 and pad layer 26 are in substantial alignment with one another. Substrate 22 has a first substrate surface 28, a second substrate surface 30 and a perimeter surface 32 between and about the perimeter of second substrate surface 30. A stepped-edge surface 31 extends around the perimeter of pad layer 26, adjacent to multi-layer interconnect layer 24. Power pins 34 are disposed on stepped-edge surface 31. Substrate 22, including multi-layer interconnect arrangement layer 24 having multi-layer interconnect arrangement 25, and pad layer 26 are formed by conventional methods and techniques known to those skilled in the art of MCMs.

At least one integrated circuit chip 38 is disposed upon a high-density thin-film circuit region 40. High-density thin-film circuit region 40 is disposed upon first substrate surface 28. Circuitry in high-density thin-film circuit region 40 is coupled to multi-layer interconnect arrangement 25. A plurality of voltage converters 42 are disposed on first substrate surface 28 outside high-density thin-film circuit region 40. On-board voltage converters 42 convert power at one input voltage level (V1) and input current magnitude (I1), to a relatively lower output voltage level (V2) and relatively higher output current magnitude (I2). Alternatively, voltage converters 42 convert power at one input voltage level and current magnitude, to a plurality of relatively lower output voltage levels and a plurality of relatively higher output current magnitudes.

Figure 1B:
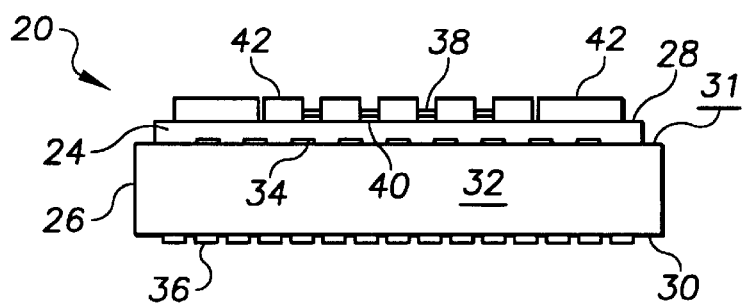
FIG. 1B is a perspective end view of one example embodiment of an MCM in accordance with the present invention.

FIG. 1B is a perspective end view of an MCM according to one example embodiment of the present invention. Signal pins 36 are disposed upon second substrate surface 30. Power pins 34 and signal pins 36 are coupled to multi-layer interconnect arrangement 25. Power pins 34 provide connection termination points for receiving power onto MCM 20 from one or more external power sources (not shown). Power pins 34 also provide connection termination points for ground and other external power supply interconnections.

Figure 1C:
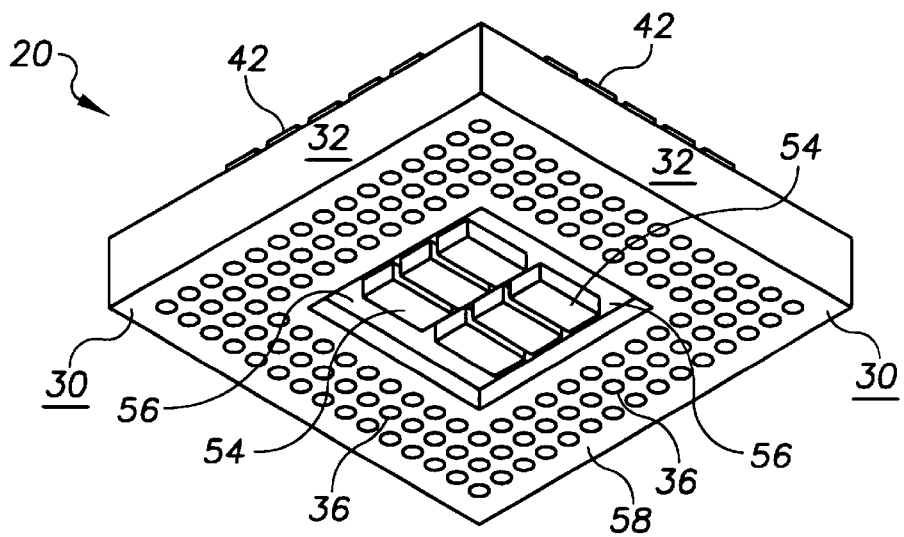
FIG. 1C is a bottom perspective view of one example embodiment of an MCM illustrating arrangement of voltage converters on the MCM second substrate surface in accordance with the present invention.

FIG. 1C is a perspective view of MCM 20 second substrate surface 30 with signal pins 36 disposed thereon. Signal pins 36 provide connection points for electronically communicating data to and from MCM 20. Second substrate surface 30 has an interior portion 56 and a peripheral portion 58. Second substrate surface interior portion 56 is substantially aligned with high-density thin-film circuit region 40. Second substrate surface interior portion 56 is recessed from peripheral portion 58 as shown in FIG. 1C. A second plurality of voltage converters 54 is disposed on second substrate surface interior portion 56. In another example embodiment of the present invention, a third plurality of voltage converters is disposed on peripheral portion 58.

Figure 2A:
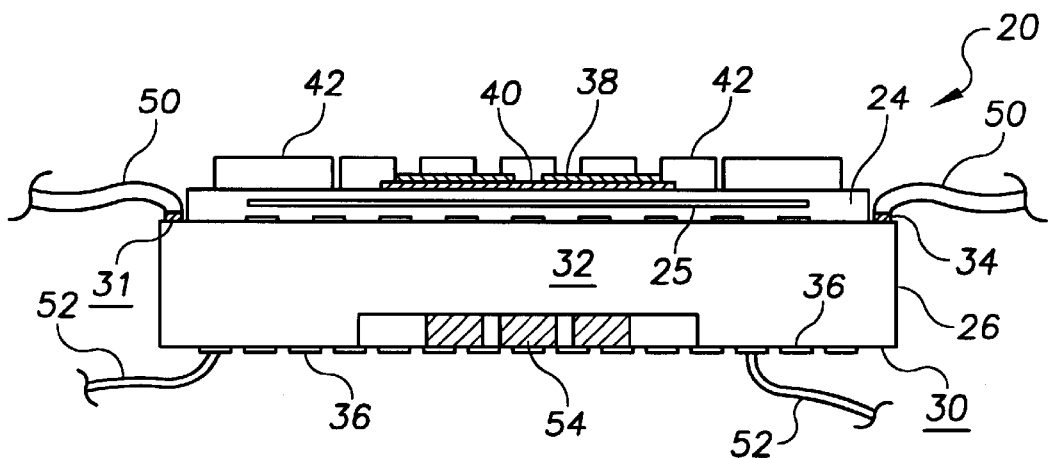
FIG. 2A is a cross-sectional view of one example embodiment of an MCM illustrating power pins disposed on a substrate stepped-edge surface in accordance with the present invention.

FIG. 2A is a cross-sectional view of MCM 20. External power conductors 50 couple at least one external power source (not shown) to MCM 20. One end of external power conductors 50 terminate on MCM 20 at power pins 34. The size and quantity of power pins 34 are selected as necessary to accommodate MCM 20 input power requirements and input current magnitudes. Power pin 34 size and quantity are a function of input current magnitude, as well as available MCM 20 surface area. Input current magnitude is a function of input voltage magnitude and MCM 20 power requirements. The quantity of power pins 34 disposed upon MCM 20 ranges up to many thousands. Power received at power pins 34 is further distributed to integrated circuit chips 38 through multi-layer interconnect arrangement 25, voltage converters 42 and 54, and high-density thin-film circuit region 40.

Figure 2B:
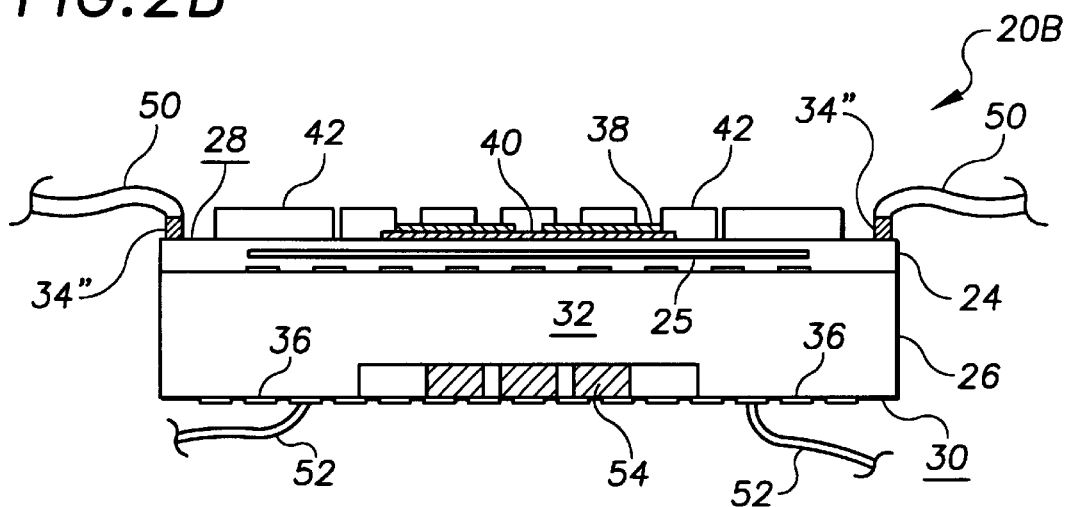
FIG. 2B is a cross-sectional view of one example embodiment of an MCM illustrating power pins disposed on a substrate first surface in accordance with the present invention.

FIG. 2B is another embodiment of an MCM according to the present invention and generally indicated at 20B. MCM 20B is not formed to have a stepped-edge surface 31 upon which to dispose power pins 34". Rather, the edges of multi-layer interconnect arrangement layer 24 extend in substantial alignment with the edges of pad layer 26 as shown. Power pins 34" are disposed upon MCM 20B substrate first surface 28. In one example embodiment (shown), power pins 34" are disposed near the perimeter of substrate first surface 28.

Figure 2C:
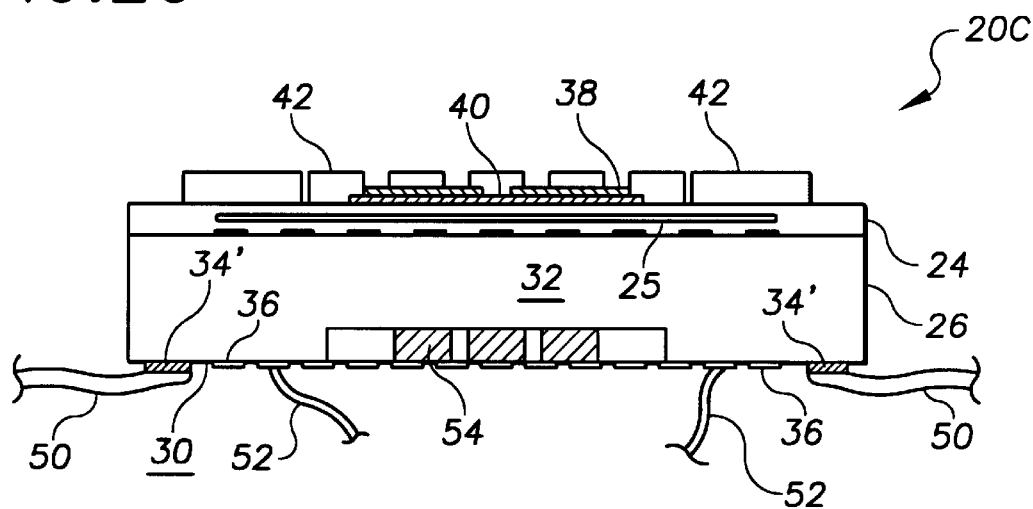
FIG. 2C is a cross-sectional view of one example embodiment of an MCM illustrating power pins disposed on a substrate second surface in accordance with the present invention.

FIG. 2C is another embodiment of an MCM according to the present invention and generally indicated at 20C. Power pins 34' are disposed upon MCM 20C substrate second surface 30. In the example embodiment shown, power pins 34' are disposed near the perimeter of substrate second surface 30.

Figure 2D:
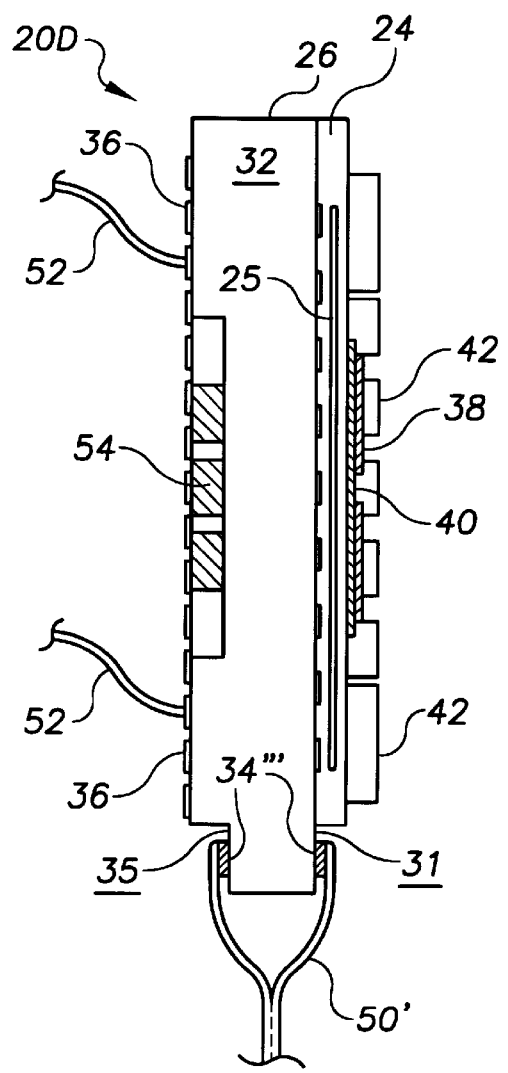
FIG. 2D is a cross-sectional view of one example embodiment of an MCM having edge power pins in accordance with the present invention.

FIG. 2D is a further embodiment of an MCM according to the present invention and generally indicated at 20D. MCM 20D has a stepped-edge 31 and a further second stepped-edge 35. Power pins 34'" are disposed upon stepped-edge 31 and second stepped-edge 35. In one example embodiment, power pins 34'" of one voltage polarity are disposed on stepped-edge 31, and power pins 34'" of a second polarity (or ground) are disposed on second stepped-edge 35. In the embodiment illustrated in FIG. 2D, stepped-edge 31 and stepped-edge 35 are formed along one side of MCM 20D. In other embodiments, the stepped-edges 31 and 35 respectively, are formed along multiple sides of MCM. External power conductors 50' couple at least one external power source (not shown) to MCM 20D, and is adapted to accommodate configuration of segregated voltage polarities.

Figure 3:
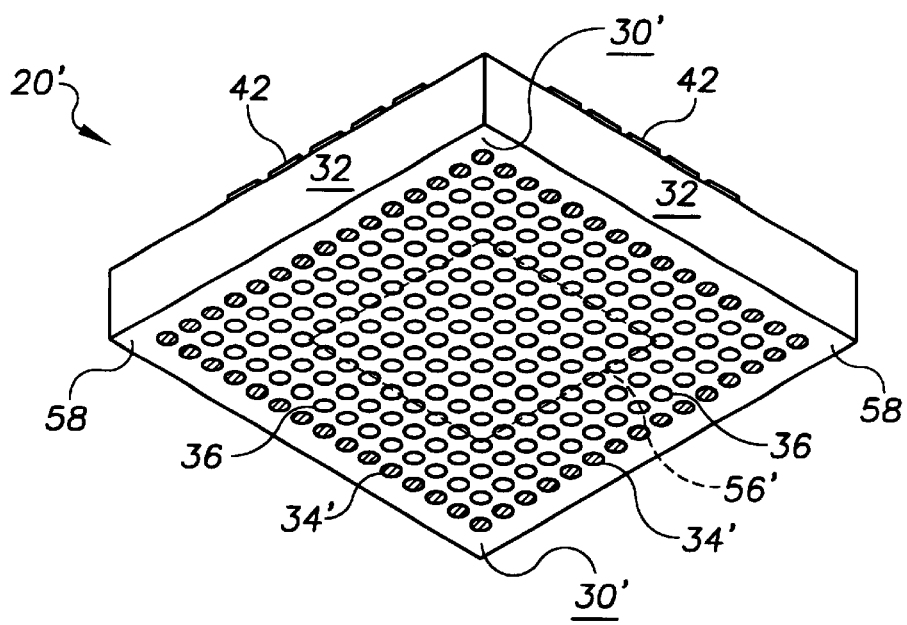
FIG. 3 is a perspective view of a further example embodiment of an MCM illustrating non-recessed second substrate surfaces having power and signal pins in accordance with the present invention.

Referring now to FIG. 3, another example embodiment of the present invention is provided. FIG. 3 is illustrates a bottom perspective view of substrate second surface 30'. Substrate second surface 30' has an interior portion 56' and a peripheral portion 58. Interior portion 56' is not recessed on MCM 20'. Although MCM 20' is shown having signal pins 36 disposed on interior portion 56', additional embodiments of the present invention include disposing voltage converters 54 on non-recessed interior portion 56' of second substrate surface 30'. MCM 20' has power pins 34' disposed on substrate second surface 30' about a perimeter, in a fashion similar to MCM 20C illustrated in FIG. 2C. Optionally, power pins 34' are disposed along less than all segments of the perimeter of substrate second surface 30'.

In one embodiment, voltage converters convert power received by MCM 20. In a further embodiment, voltage converters 42 are coupled in cascade electrically, and adapted to convert power, as received by MCM 20 at an input voltage and current, first to a relatively lower intermediate voltage and relatively higher intermediate current, then to an even relatively lower output voltage and even relatively higher output current. For example, a first portion of voltage converters 42 convert power at one input voltage level and input current magnitude, to a relatively lower output voltage level and relatively higher output current magnitude. Subsequently, a second portion of voltage converters 42 further convert the relatively lower voltage and relatively higher current magnitude, to an even lower voltage output and an even higher current magnitude output.

Voltage converters 42 are discrete components, initially independent and separate from first substrate surface 28 and multi-layer interconnect arrangement layer 24. A plurality of twenty (20) voltage converters 42 is shown in FIG. 1A. The quantity of voltage converters 42 illustrated in FIG. 1A is limited for clarity. The present invention may be practiced with a quantity of voltage converters 42 greater or fewer than the quantity illustrated in FIG. 1A. The quantity of voltage converters 42 disposed upon MCM 20 is dependent on MCM 20 size (area of substrate first surface 28) and power requirements, as well as voltage converter 42 size and power converting capacity. In one example embodiment of the present invention, a plurality of 30–40 voltage converters 42 is arranged on first substrate surface 28 around high-density thin film circuit region 40.

Voltage converters 42 are arranged upon first substrate surface 28 around, and in close proximity to, high-density thin-film circuit region 40. While FIG. 1A illustrates an embodiment of the present invention having voltage converters 42 located on all sides surrounding a centrally-located high-density thin-film circuit region 40, other example embodiments of the present invention include voltage converters 42 disposed on fewer than all sides of high-density thin-film circuit region 40. In one example embodiment of the present invention, high-density thin-film circuit region 40 is located offset from center on substrate first surface 28.

Data is electronically communicated to and from the MCM via external signal conductors 52. One end of external signal conductors 52 terminates at signal pins 36. As shown in FIG. 2C, signal pins 36 are disposed over the remaining area of second substrate surface 30 not occupied by power pins 34'. Signal pins 36 are generally segregated away from power pins 34' to minimize power-generated noise effects and preserve data integrity. Because power pins 34' are generally disposed near the perimeter of second substrate surface 30, signal pins 36 are generally disposed on substrate second surface 30, interior to power pins 34' Signal pins 36 can also be disposed near perimeter portions of second substrate surface 30, when not occupied by power pins 34 disposed thereon (such as is illustrated in FIGS. 2A, 2B and 2D). In one example embodiment of the present invention, signal pins 36 are also disposed upon first substrate surface 28. The number of signal pins 36 disposed upon MCM first and second substrate surfaces ranges up to many thousands. Signal pins 36 and power pins 34 are not shown to scale or quantity in the figures for clarity.

MCM 20 is powered from at least one external power source (not shown). In general, as power supply voltage decreases, current magnitude must increase correspondingly to maintain a constant power. Integrated circuit chips 38 constitute millions of logic gates operating at low voltages (for reasons set forth above), typically 3.0 Vdc and below. In order to supply MCM 20 with sufficient power quantities at such low voltage levels, current magnitudes exceeding hundreds of amperes are possible. Conventionally, power is supplied to multi-chip modules at integrated circuit chip 38 operating voltage, and at high current. High MCM input current magnitudes result in high IR voltage drop, high inductive coupling and $I^2R$ losses, and high rf noise transmission impacting data integrity. In addition, high MCM input current magnitudes require larger external power conductors, complicate MCM on-board conductor routing, and negatively impact MCM size and cost.

Figure 4:
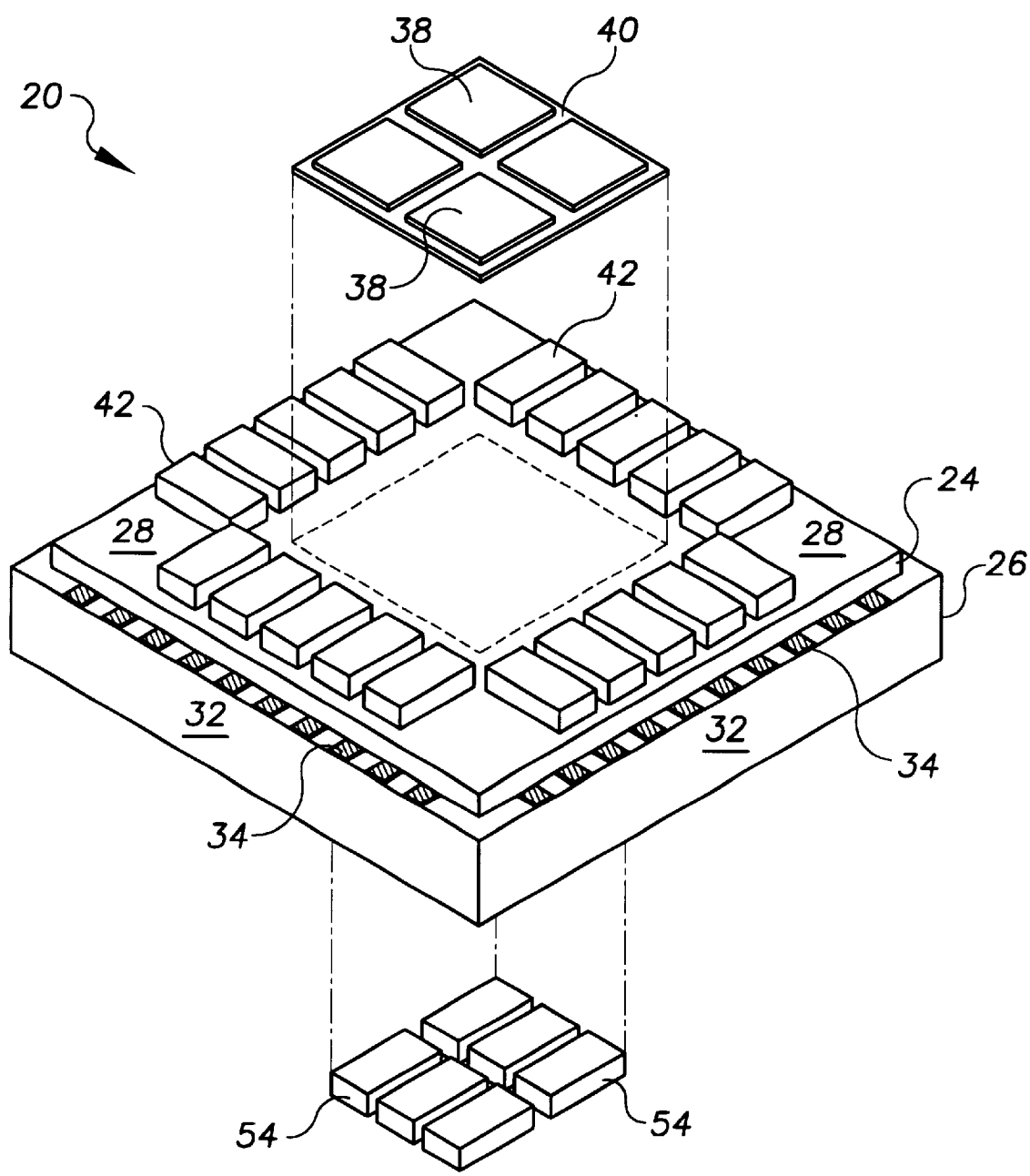
FIG. 4 is an exploded perspective view of one example embodiment of an MCM in accordance with the present invention.

FIG. 4 illustrates an exploded perspective view of one example embodiment of MCM 20. Integrated circuit chips 38 are disposed on high-density thin-film circuit region 40. In a first method, high-density thin-film circuit region 40 is formed independent from first substrate surface 28 by conventional techniques, and subsequently joined to first substrate surface 28 (a decal method). Alternatively, high-density thin-film circuit region 40 is formed integrally upon first substrate surface 28, by building-up thin-film layers, using conventional techniques, directly upon first substrate layer 28 (a build-up method).

MCM 20 cost considerations favor minimizing the size of high-density thin-film circuit region 40. High-density thin-film circuit region 40 may be configured in a variety of geometries, and arranged in numerous locations upon first substrate surface 28. Maximum interconnect efficiency is typically achieved by locating high-density thin-film circuit region 40 centrally on first substrate surface 28 as shown in FIG. 1A. The specific geometry of high-density thin-film circuit region 40 is dependent on the quantity and arrangement of integrated circuit chips 38 which are interconnected by circuitry in high-density thin-film circuit region 40.

Figure 5:
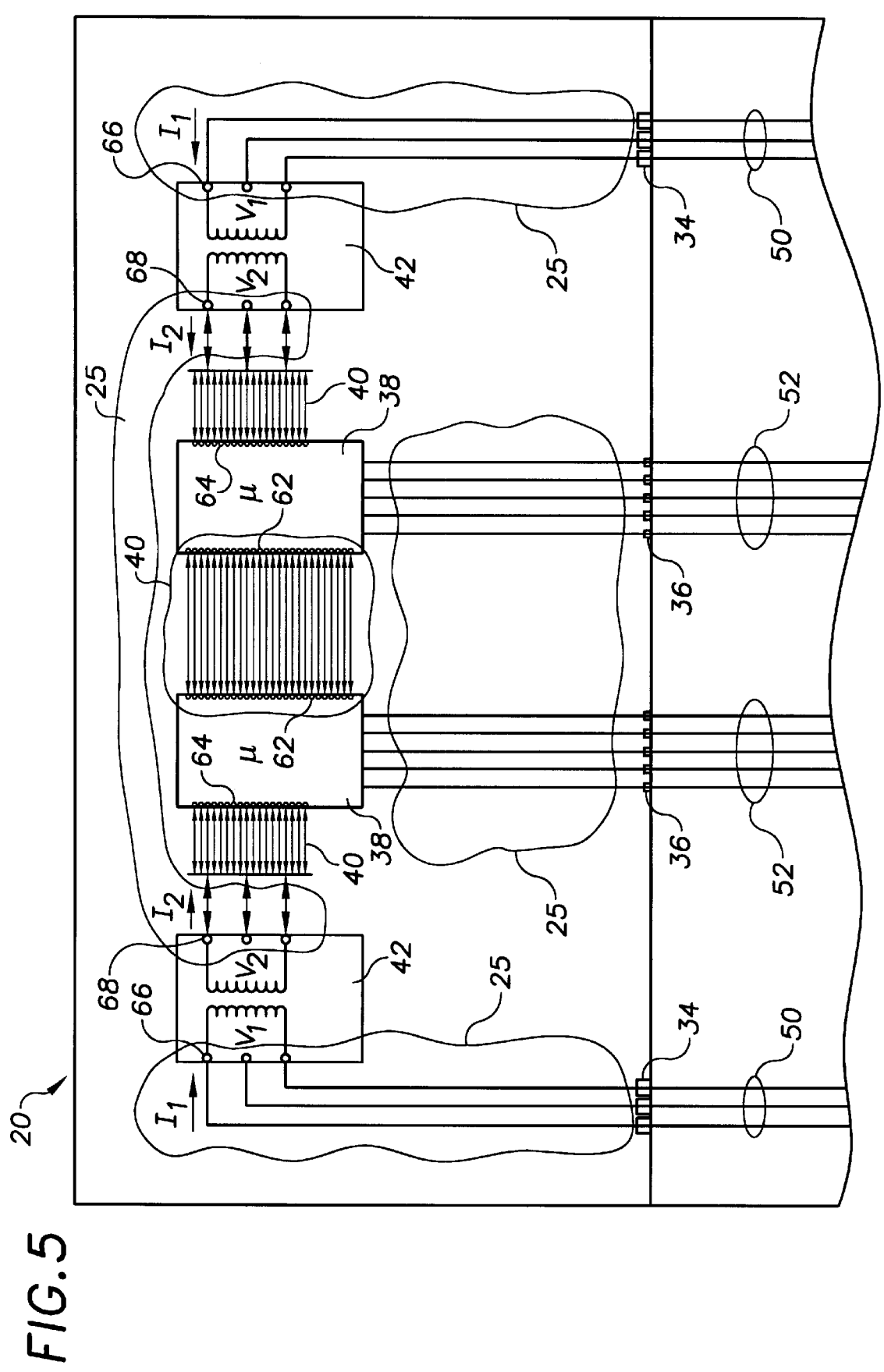
FIG. 5 is a schematic representation of one example embodiment of an MCM having high-density thin-film circuit region power interconnections in accordance with the present invention.

FIG. 5 schematically represents simplified circuit arrangement of MCM 20 features as described hereinafter. Voltage converters 42, while symbolized for illustration as a transformer, may be implemented in a variety of known voltage conversion technologies. A simplified electrical circuit for second 54 and a third plurality of voltage converters is similar to that shown in FIG. 5.

Integrated circuit chips 38 each have a plurality of signal terminals 62. Signal terminals 62 are coupled to circuitry in high-density thin-film circuit region 40. Data is electronically communicated between integrated circuit chips 38 and high-density thin-film circuit region 40 through signal terminals 62. Integrated circuit chips 38 each have a plurality of power terminals 64. Power terminals 64 are coupled to circuitry in high-density thin-film circuit region 40. Power (and ground) signals are transmitted between circuitry in high-density thin-film circuit region 40 and integrated circuit chips 38 through power terminals 64.

The first plurality of voltage converters 42 each have power input terminals 66 and power output terminals 68. Power input terminals 66 and power output terminals 68 are coupled to multi-layer interconnect arrangement 25. Multi-layer interconnect arrangement 25 comprises a series of isolated interconnecting electrical pathways, including planes, arranged in a 3-dimensional configuration. For clarity of illustration, FIG. 5 represents multi-layer interconnect arrangement 25 as a series of continuity paths between MCM 20 components. Similarly, while high-density thin-film circuit region 40 continuity paths are represented in FIG. 5 as discrete conductors for ease of illustration, those skilled in the art will appreciate that high-density thin-film circuit region 40 is comprised of layers of insulated thin-film pathways arranged in a 3-dimensional configuration. Multi-layer interconnect arrangement 25 and circuitry in high-density thin-film circuit region 40 are electrically coupled together at their junction on first substrate surface 28.

One embodiment of an MCM subassembly includes substrate 22 having internal multi-layer interconnect arrangement 25, power pins 34, signal pins 36, high-density thin-film circuit region 40 disposed on substrate first surface 28. Operability, functionality, and electrical circuit continuity of the MCM subassembly are tested prior to mounting and electrically coupling integrated circuit chips 38, or first 42, second 54, or third pluralities of voltage converters to the MCM subassembly. In another embodiment, a method further includes testing the each of integrated circuit chips 38, first 42, second 54, and third pluralities of voltage converters before mounting and electrically coupling the discrete components to the MCM subassembly. In a further embodiment, MCM subassembly includes integrated circuit chips 38 disposed on high-density thin-film circuit region 40, and intermediate testing of the MCM subassembly is performed prior to mounting and electrically coupling first 42, second 54, or third pluralities of voltage converters to the MCM subassembly. First 42, second 54, and third pluralities of voltage converters are tested for operability, functionality, and electrical continuity prior to mounting on the MCM subassembly.

Figure 6A:
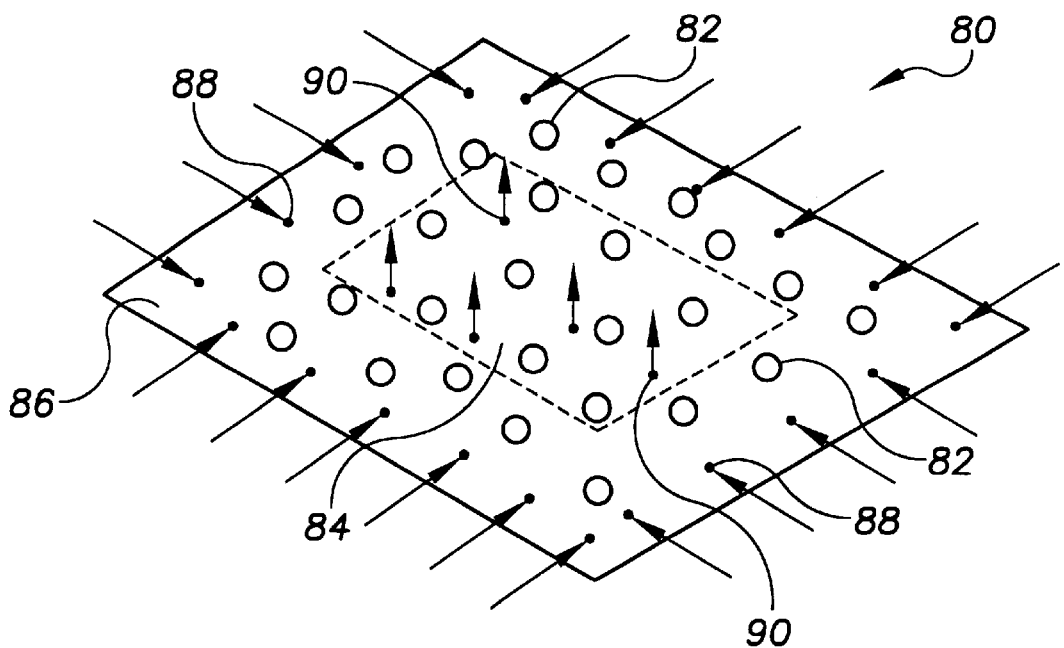
FIG. 6A is a perspective view of one example embodiment of an MCM power plane layer having peripherally-located power input points in accordance with the present invention.

FIG. 6A represents one power plane layer 80 within multi-layer interconnect arrangement 25. Multi-layer interconnect arrangement 25 may include many power plane layers 80, some being complimentary ground plane layers. Considerations discussed below with regard to power plane layers 80 are applicable to the electrical behavior of ground plane layers as well. Alternatively, a single ground plane layer may serve as an electrical reference potential for multiple power plane layers 80. In one example embodiment, power plane layer 80 is an electrically-conducting plane having vertical interconnect access areas (i.e., holes) 82 therethrough, allowing vertical conductive paths of multi-layer interconnection arrangement 25 to pass through power plane layer 80 without electrical connection at power plane layer 80. Power plane layer has an interior portion 84, and a peripheral portion 86. Interior portion 84 is in substantial alignment with high-density thin-film circuit region 40. Circuitry in high-density thin-film circuit region 40 is connected to interior portion 84 of multi-layer interconnect arrangement 25. Integrated circuit chips 38 draw power from interior portion 84 of power plane layer 80 through high-density thin-film circuit region 40.

Power enters power plane layer 80 at multiple locations, which are represented as a power source points 88 and depicted in FIG. 6A by an arrow with a dot located at the arrow's head (the dot indicating the point of power entry). Power source points 88 exist at connections to power plane layer 80 from various sources which can include coupling to voltage converter outputs 68, coupling to power pins 34 or interconnections between power plane layers 80. The quantity of power source points 88 illustrated in FIG. 6A is limited for clarity, and may exceed many hundreds or thousands.

Power is drawn from power plane layer 80 through a power drain point 90. Power drain points 90 are depicted in FIG. 6A by an arrow with a dot located at the arrow's tail, the dot locating the position from which power exits power plane layer 80. The majority of power exits power plane layer interior portion 84 since circuitry in high-density thin-film circuit region 40 is connected to multi-layer interconnect arrangement interior portion 84. Therefore in general, power enters power plane layer 80 at peripheral portion 86, flows in power plane layer 80, and exits power plane layer 80 at interior portion 84 to high-density thin-film circuit region 40 (and ultimately is delivered to integrated circuit chips 38).

To illustrate by way of one example, consider power source points 88 from connections between power plane layer 80 and first plurality of voltage converters 42. Voltage converters 42 are disposed on first substrate surface 28 outside high-density thin-film circuit region 40 and connected to peripheral portion 86 of power plane layer 80. These connections at peripheral portion 86 of power plane layer 80 are illustrated in FIG. 6A as power source points 88 located in peripheral portion 86. Power plane layer 80 receives power at power source points 88 in peripheral portion 86 from voltage converter outputs 68. Power flows in power plane layer 80 from peripheral portion 86, to interior portion 84, where it exits to high-density thin-film circuit region 40. Power flow through power plane layer 80 is subject to all the side-effects associated with power flow through a conductor as will be appreciated by those skilled in the art.

Figure 6B:
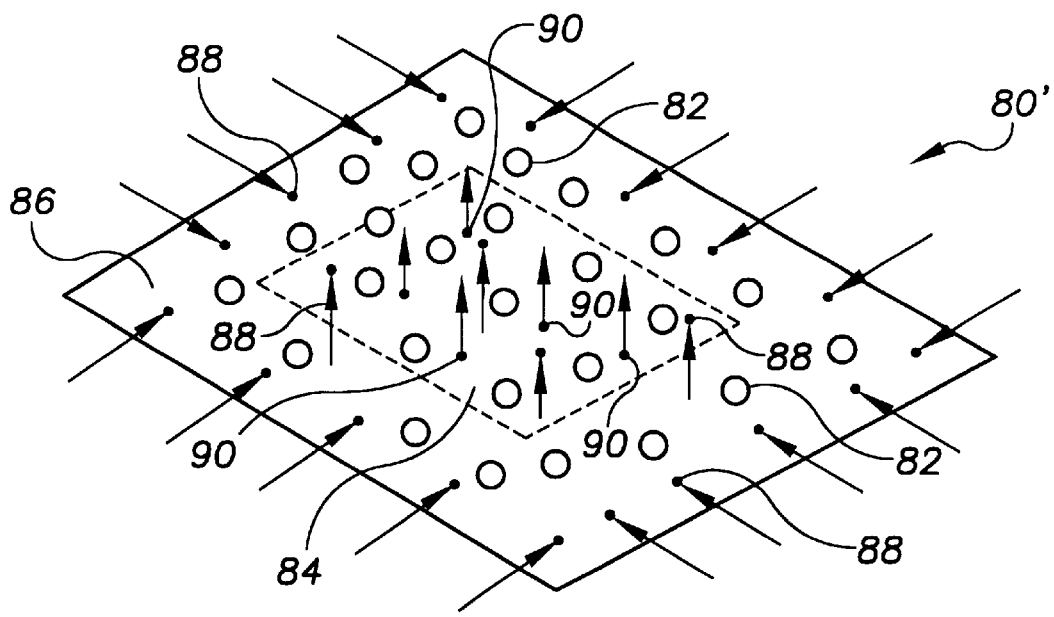
FIG. 6B is a perspective view of a further example embodiment of an MCM power plane layer having distributed power input points in accordance with the present invention.

Referring now to FIG. 6B, which illustrates another example embodiment of the present invention showing power source points 88 also being located within interior portion 84 of power plane layer 80. Power source points 88 located in interior portion 84 represent connections to power plane layer 80, within interior portion 84, through which power is delivered to power plane layer 80. Power source points 88 located within interior portion 84 result, for example, from second plurality of voltage converters 54, disposed on second substrate surface interior portion 56 and connected to power plane layer 80 at interior portion 84. In a further example embodiment, a portion of first plurality of voltage converters 42 are connected to internal portion 84 of power plane layer 80.

Locating power source points 88 within interior portion 84, closer to power drain points 90, has advantages including reducing the length of power plane layer 80 through which power must flow. Reducing power flow path length reduces associated side-effects of current flow through a conductor such as IR drop, $I^2R$ losses, L di/dt noise within power plane layer 80, and rf noise generation. In a further example embodiment of the present invention, third plurality of voltage converters, disposed on second substrate surface 30, are also coupled to power plane layer 80. Power drain points 90 also occur where voltage converter input terminals are coupled to power plane layer 80.

Figure 7:
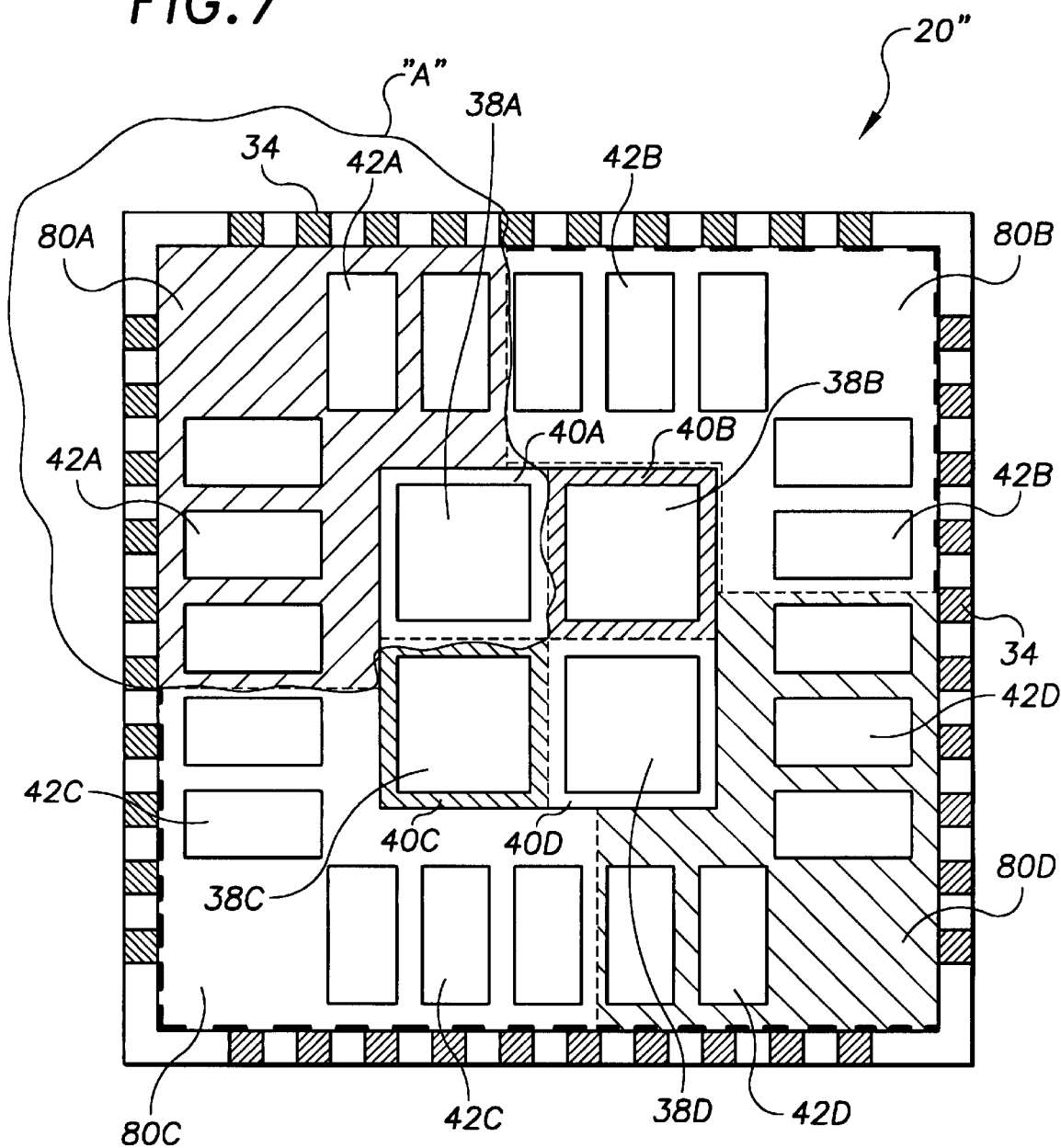
FIG. 7 is a plan view of one example embodiment of an MCM illustrating segmented power regions in accordance with the present invention.

FIG. 7 is a plan view of MCM 20" according to a further example embodiment of the present invention and illustrating segmented power regions. Power regions isolate power and ground noise from individual ICs and allow for different voltage regulation schemes. The components of each power region are isolated from components of the other power regions. Power regions serve dedicated ICs and have dedicated voltage converters, power plane layers (including ground plane layers) and dedicated portions of the high-density thin-film circuit region. For example, four power regions are illustrated in the embodiment shown in FIG. 7: regions A, B, C and D. Each power region comprises at least one IC, an isolated high-density thin-film circuit region portion supplying said IC(s), at least one isolated power plane layer supplying said isolated high-density thin-film circuit region portion, and dedicated voltage converters supplying the at least one isolated power plane layer. For example, IC 38A, high-density thin-film circuit region portion 40A, power plane layer 80A and voltage converters 42A comprise power region A.

Power plane layers A, B, C and D are shown in FIG. 7 as isolated power plane layer regions, all located within the same horizontal plane, but electrically independent from one another. In another example embodiment, power plane layers are located in different horizontal layers and isolated vertically. Power regions are formed from electrically segregated and isolated components. The electrically segregated and isolated components need not be geographically segregated, as is shown in FIG. 7 for clarity of the present invention. In a further embodiment of the present invention, a power region includes only a portion of an IC and need not encompass an entire IC. In another embodiment, a power region includes portions of multiple ICs. Non-overlapping portions of a particular IC are included in seperate power regions, a feature of power regions being electrical isolation between power regions.

Accordingly, the present invention is not to be necessarily limited to the particular examples described above, but is intended to cover all aspects of the invention as fairly set out in the attached claims. For instance, while discrete voltage converters mounted upon an MCM are illustrated, other voltage converter and MCM constructions can benefit from the above-mentioned teachings. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A multi-chip module (MCM) comprising:
a substrate having a substrate first surface including a high-density thin-film circuit region disposed thereon, power pins, a substrate second surface including signal pins disposed thereon, and a multi-layer interconnect arrangement disposed between the substrate first surface and the substrate second surface, the multi-layer interconnect arrangement coupled to circuitry in the high-density thin-film circuit region and the signal and power pins;
a plurality of integrated circuit chips disposed on the high-density thin-film circuit region, each of the integrated circuit chips having a plurality of signal terminals and power terminals, the signal terminals and power terminals coupled to circuitry in the high-density thin-film circuit region; and
a first plurality of voltage converters disposed on the substrate first surface outside the high-density thin-film circuit region, each voltage converter having a plurality of power input terminals and power output terminals, the power input and output terminals coupled to the multi-layer interconnect arrangement, wherein the voltage converters convert an input voltage and an input current to a relatively lower output voltage and a relatively higher output current.

2. The MCM of claim 1, wherein the power pins are disposed on the substrate first surface.

3. The MCM of claim 2, wherein the power pins are disposed adjacent a perimeter of the substrate first surface.

4. The MCM of claim 1, wherein the power pins are disposed on the substrate second surface.

5. The MCM of claim 4, wherein the power pins are disposed adjacent a perimeter of the substrate second surface.

6. The MCM of claim 1, wherein the substrate further includes a stepped-edge surface about portions of a perimeter of the substrate first surface, the power pins being disposed on the stepped-edge surface.

7. The MCM of claim 6, wherein the substrate further includes a second stepped-edge surface about portions of a perimeter of the substrate second surface and opposing stepped-edge surface, the power pins being disposed on the stepped-edge and second stepped-edge surfaces.

8. The MCM of claim 1, wherein the multi-layer interconnect arrangement has at least one power plane layer, each power plane layer having an interior portion substantially aligned with the high-density thin-film circuit region, and a peripheral portion outside the interior portion, and wherein circuitry in the high-density thin-film circuit region is coupled to the interior portion of the at least one power plane layer, and the power output terminals of the first plurality of voltage converters are coupled to the peripheral portion of the at least one power plane layer.

9. The MCM of claim 8, wherein the multi-layer interconnect arrangement has at least two power plane layers, at least one power plane layer being a ground plane layer.

10. The MCM of claim 8, wherein circuitry in the high-density thin-film circuit region is connected to the interior portion of the at least one power plane layer, and the power output terminals of the first plurality of voltage converters are connected to the peripheral portion of the at least one power plane layer.

11. The MCM of claim 8, further comprising a second plurality of voltage converters disposed on the substrate second surface, each voltage converter having a plurality of power input terminals and power output terminals, the power input and output terminals coupled to the multi-layer interconnect arrangement, wherein the voltage converters convert an input voltage and an input current to a relatively lower output voltage and a relatively higher output current.

12. The MCM of claim 11, wherein the second plurality of voltage converters is arranged on a substrate second surface interior portion, the interior portion being substantially aligned with the high-density thin-film circuit region.

13. The MCM of claim 12, wherein the substrate second surface interior portion is recessed.

14. The MCM of claim 12, wherein the power output terminals of the second plurality of voltage converters are coupled to the interior portion of the at least one power plane layer.

15. The MCM of claim 14, wherein the power output terminals of the second plurality of voltage converters are connected to the interior portion of the at least one power plane layer.

16. The MCM of claim 1, wherein the first plurality of voltage converters are discrete components.

17. The MCM of claim 1, wherein the first plurality of voltage converters convert the input voltage to a plurality of relatively lower output voltages and convert the input current to a plurality of relatively higher output currents.

18. The MCM of claim 1, wherein a portion of voltage converters are coupled in cascade, the cascade voltage converters adapted to convert an input voltage and an input current, first to a relatively lower intermediate voltage and a relatively higher current, and then to an even relatively lower output voltage and an even relatively higher output current.

19. A multi-chip module (MCM) comprising:
a substrate having a substrate first surface, and a substrate second surface; and
a plurality of electrically-isolated power regions, wherein each power region includes,
a high-density thin-film circuit region portion disposed upon substrate first surface,
power pins,
signal pins,
a multi-layer interconnect arrangement portion disposed between the substrate first surface and the substrate second surface and coupled to circuitry in the high-density thin-film circuit region portion and the signal and power pins,
at least one integrated circuit chip disposed on the high-density thin-film circuit region portion, each of the integrated circuit chips having a plurality of signal terminals and power terminals, the signal terminals and power terminals coupled to circuitry in the high-density thin-film circuit region portion; and
a first plurality of voltage converters disposed on the substrate first surface outside the high-density thin-film circuit region portion, each voltage converter having a plurality of power input terminals and power output terminals, the power input and output terminals coupled to the multi-layer interconnect arrangement portion, wherein the voltage converters convert an input voltage and an input current to a relatively lower output voltage and a relatively higher output current.

* * * * *